United States Patent
Jolley et al.

(10) Patent No.: US 6,812,474 B2
(45) Date of Patent: Nov. 2, 2004

(54) PATTERN GENERATION METHOD AND APPARATUS USING CACHED CELLS OF HIERARCHICAL DATA

(75) Inventors: Matthew J. Jolley, Beaverton, OR (US); Asher Klatchko, Portland, OR (US); Robert Marc Sills, Castro Valley, CA (US)

(73) Assignee: Applied Materials, Inc., Santa Clara, CA (US)

(*) Notice: Subject to any disclaimer, the term of this patent is extended or adjusted under 35 U.S.C. 154(b) by 146 days.

(21) Appl. No.: 09/905,561

(22) Filed: Jul. 13, 2001

(65) Prior Publication Data

US 2003/0010937 A1 Jan. 16, 2003

(51) Int. Cl.$^7$ .............................. G21G 5/00; G21K 5/10
(52) U.S. Cl. ............................. 250/492.22; 250/492.23; 700/119; 716/19
(58) Field of Search .................. 250/492.22, 492.3, 250/492.23; 716/19; 430/5, 296; 700/119

(56) References Cited

U.S. PATENT DOCUMENTS

| | | | |
|---|---|---|---|
| 5,159,201 A | * 10/1992 | Frei | 250/492.2 |
| 5,239,624 A | 8/1993 | Cook et al. | 395/125 |
| 5,371,373 A | 12/1994 | Shibata et al. | 250/492.22 |
| 5,533,170 A | 7/1996 | Teitzel et al. | 358/1.8 |
| 5,535,128 A | * 7/1996 | Laube et al. | 700/119 |
| 5,852,443 A | 12/1998 | Kenworthy | 345/431 |

(List continued on next page.)

FOREIGN PATENT DOCUMENTS

| | | | |
|---|---|---|---|
| WO | WO 98/38597 | 9/1998 | G06K/15/12 |

OTHER PUBLICATIONS

Johansson, C., et al., "Scalable Pattern Generator Data Path—For the Future," 8 pages (2000).

Buck, P., et al., "Integration of the Micronic Omega6500 into the Mask Manufacturing Environment," 9 pages (2000).

Primary Examiner—John R. Lee
Assistant Examiner—Kalimah Fernandez
(74) Attorney, Agent, or Firm—Shirley Church

(57) ABSTRACT

A pattern generation method and system in which hierarchical image data (determining a pattern to be imaged on a target) is received at a graphics engine having a memory, at least one cell determining a repeated feature or set of features of the pattern is stored in the memory, and beam control data is generated in response to the image data. The image data includes residual data including at least two subroutine call commands for each cell stored in the memory. In response to each subroutine call command, the graphics engine retrieves a cell (identified by the command) from the memory, and asserts beam control data that determines a feature or feature set determined by the cell to be imaged at (or beginning at) a location on the target identified by the command. The subroutine call commands can be distributed throughout the image data, including in at least one cell to be cached as well as in the residual data. Preferably, the graphics engine caches each cell of the image data in the memory and generates a set of beam control data in response to each subroutine call command including by retrieving a cached cell from the memory and generating the beam control data in response to the retrieved cell. Alternatively, the graphics engine generates a cell of beam control data in response to each cell of image data, caches each such beam control data cell in the memory, and responds to each subroutine call command of the image data by retrieving a cached beam control data cell from the memory and asserting the retrieved beam control data cell as part of a set of beam control data that determines a feature or feature set (determined by the retrieved cell) to be imaged on the target. Another aspect of the invention is a method and apparatus for determining cells of hierarchical image data (to be transferred to a graphics engine) by analyzing hierarchical raw image data and transforming the raw image data into optimized hierarchical image data including the cells.

34 Claims, 1 Drawing Sheet

U.S. PATENT DOCUMENTS

| | | | |
|---|---|---|---|
| 5,995,878 A | * 11/1999 | Miyajima | 700/121 |
| 6,035,113 A | 3/2000 | Gerber et al. | 395/500.2 |
| 6,047,116 A | * 4/2000 | Murakami et al. | 716/19 |
| 6,189,135 B1 | * 2/2001 | Chisaka | 716/19 |
| 6,415,432 B1 | * 7/2002 | Saito et al. | 716/21 |
| 6,543,044 B2 | * 4/2003 | Inanami et al. | 716/21 |

* cited by examiner

PATTERN GENERATION METHOD AND APPARATUS USING CACHED CELLS OF HIERARCHICAL DATA

TECHNICAL FIELD OF THE INVENTION

The present invention relates to pattern generation methods and apparatus in which at least one beam (e.g., at least one laser beam or at least one electron beam) is controlled to produce a pattern on a target. In typical embodiments, the invention is a microlithographic method and apparatus in which at least one cell of a set of hierarchical image data is cached and then retrieved during conversion of the image data into beam control data (having pixel or vector format) suitable for causing a beam to produce a patterned mask.

BACKGROUND OF THE INVENTION

Pattern generation equipment is used for microlithographic applications such as the fabrication of masks for use in producing integrated circuits, as well as for other applications.

Some pattern generation systems use a raster writing strategy in which a laser or electron beam is swept over the target along a raster scan path, as the beam intensity is modulated to write pixels which determine a pattern on the target. In some implementations of such systems, the target is mounted on a movable stage and the beam moves back and forth along a first axis (in the plane of the target) while the stage moves the beam along an axis perpendicular to the first axis. In operation of pattern generation systems that use a raster writing strategy, sets of raw image data are received, and a raster engine is employed to rasterize each set of raw image data to generate a set of rasterized data. The rasterized data is in "pixel format" in the sense that it comprises a sequence of pixels to be written (sequentially) during one raster scan. Each pixel in the sequence can be a binary value (0 or 1), or a gray scale value.

U.S. Pat. No. 5,533,170, issued on Jul. 2, 1996, to R. L. Teitzel, et al., describes a raster engine for a pattern generation apparatus, and suggests that the data processed by the raster engine can include data objects that are called like subroutines so that a hierarchical structure can be built by called subroutines.

Other pattern generation systems do not rasterize raw image data into pixel format but instead convert raw image data into "vector format" data. The vector format data comprises a sequence of vectors, each determining a location (at which a scan begins) and a magnitude indicative of the length (or duration) of the scan. Typically, the location is expressed as an offset from a reference point. In response to a set of vector format data, a beam performs a sequence of scans in which it is directed to a first location on the target and executes a scan (e.g., a raster scan over a small area) starting at the first location and having the indicated length or duration, and then jumps to a second location on the target and executes another scan having the length or duration corresponding to the second location, and so on.

In another type of pattern generation system (sometimes referred to as "shaped spot" systems), the target is exposed by a sequence of shots of a variably shaped beam. To perform each shot, the beam is controlled (e.g., by manipulating apertures in the beam path) so that its projection on the target has a selected shape (e.g., a rectangle or triangle), and a selected region of the target is exposed to the shaped beam for a selected duration of time. This type of system converts raw image data into vector format data comprising a sequence of vectors, each vector determining a location (on the target) for one shot (in a sequence of shots) and a magnitude indicative of a configuration of beam control components determining a selected projected beam shape for the shot (and optionally also the shot duration).

Other pattern generation systems used for microlithography are known as "cell projection" systems. A cell projection system is used to expose the target to a sequence of shots. To accomplish each shot, a beam is projected onto the target through a pattern of holes determined by a wafer. The wafer can determine either one pattern or more than one pattern of holes. To accomplish each shot, the beam is controlled so that passes through a selected pattern of holes of the wafer onto a selected region of the target for a selected duration of time. This type of system converts raw image data into vector format data comprising a sequence of vectors, each vector determining a location on the target for one shot (in a sequence of shots) and control bits determining through which pattern of holes (of the wafer) the beam passes for the shot.

U.S. Pat. No. 5,371,373, issued on Dec. 6, 1994, teaches an electron beam lithography apparatus having both a cell projection system (including a selected one of masks 24–28 of FIG. 6, identified as mask 21 in FIG. 3) and a shaped spot system including mask 29 of FIG. 6 (identified as mask 21 in FIG. 3) and mask 19 and mechanism 18 of FIG. 3. The apparatus produces a pattern on object 15 in response to two-level hierarchical image data. Each of masks 24–28 is fabricated in response to a different primary cell of the hierarchical image data. In addition to fabricating masks 24–28, lithographic data (in vector format) is generated by processing the hierarchical image data. Data control system 8 responds to a stream of the lithographic data as follows: in response to each successively received unit of the lithographic data that designates one of the primary cells, a single "cell projection" shot is performed in which the beam passes through the corresponding mask 24, 25, 26, 27, or 28 to project a cell onto object 15; and in response to each successively received unit of the lithographic data that does not designate one of the primary cells, a single "shaped beam" shot is performed in which the beam passes through appropriately controlled pair of masks 19 and 29 to project a selected beam shape onto object 15. However, U.S. Pat. No. 5,371,373 does not teach any method for producing a pattern on object 15 in response to N-level hierarchical image data, where N is greater than two.

SUMMARY OF THE INVENTION

In a class of preferred embodiments of the inventive pattern generation method and system, a graphics engine ("GE") having a memory receives a set of hierarchical image data (determining a pattern to be imaged on a target), at least one cell (determining a repeated feature set) is stored in the memory, and beam control data is generated in response to the image data. The expression "feature set" is used herein to denote a feature or set of features that occurs in the pattern and the expression "repeated feature set" is denotes a feature or set of features that occurs repeatedly in the pattern. The hierarchical image data includes residual data, the residual data includes at least two subroutine call commands for each cell stored in the memory, and each subroutine call command is indicative of a location on the target and a cell to be retrieved from memory. In response to each subroutine call command, the GE retrieves a cell from the memory, and asserts beam control data that determines a feature set (determined by the cell) to be imaged on the target at (or beginning at) the location identified by the subroutine call command. The subroutine call commands can be distributed throughout the image data transferred to the GE, including in at least one cell to be cached (e.g., in a primary cell, in which case it identifies a secondary cell) as well as in the residual data.

In preferred embodiments, the GE caches each cell of the hierarchical image data in the memory, and generates a set of beam control data in response to each subroutine call command by retrieving a cached cell from the memory and generating the beam control data in response to the retrieved cell. In other embodiments, the GE generates a cell of beam control data in response to each cell of the hierarchical image data, caches each such beam control data cell (rather than the cell of image data corresponding to the beam control data cell) in the memory, and responds to each subroutine call command of the transferred image data by retrieving a cached cell of beam control data from memory and asserting the retrieved beam control data cell as part of a set of beam control data that determines a feature set (determined by the retrieved cell) to be imaged on the target at (or beginning at) the location identified by the command. In the latter embodiments, each cached beam control data cell remains statically in the memory of the GE throughout the entire lifetime of a print job.

Some embodiments of the invention include the step of, or apparatus for, generating the hierarchical image data to be transferred to the GE from a set of raw image data.

Although the beam control data generated in accordance with preferred embodiments of the invention is in pixel format, beam control data in vector format is generated in accordance with alternative embodiments of the invention. The beam control data generated in accordance with the invention can be asserted by the GE to a beam system to place the beam system in a configuration (or sequence of configurations) which causes a beam or beams controlled by the beam system to image the desired pattern (specified by the transferred hierarchical image data) on the target.

In some preferred embodiments, the GE of the inventive system is a raster engine. In some such embodiments, at least one cell of a set of hierarchical image data transferred to the GE is cached once (preferably as a bit map) in a memory of the raster engine, and the raster engine repeatedly calls the stored cell in response to subroutine call commands (included in the transferred image data) that are indicative of each location on the target at which (or beginning at which) a raster-scanned beam should image the pixels determined by the cell.

Another aspect of the invention is a method and apparatus for determining cells of hierarchical image data to be cached in the memory of a GE (or converted into cells of beam control data to be cached in the memory of a GE) by analyzing the hierarchy of a set of hierarchical raw image data and optimizing the hierarchical structure of the raw image data to transform the raw image data into a set of optimized hierarchical image data comprising the cells to be cached. This can be accomplished by a processor programmed with analysis software. The optimized hierarchical image data preferably achieves an optimal combination of the following factors: reduction of the data volume to be transferred to the GE, and minimizing (or maintaining within an acceptable limit) the time required for generating beam control data from the transferred image data and performing rasterization. The optimized hierarchical image data includes two classes of data: one or more cells which are to be cached (or converted to beam control data to be cached); and residual data. The residual data includes data indicative of non-repeated features of the layout, and subroutine call commands. The optimized hierarchical image data is communicated to the GE once, with the residual data thereof being communicated sequentially (e.g., in the order of rasterization).

In comparison with conventional pattern generation systems whose graphics engines do not cache any cell of a hierarchical data structure, and instead include graphics engines (e.g., raster engines) that work sequentially on features presented to them in streams of image data, a system embodying the present invention can be implemented with greatly reduced (e.g., by a factor of twenty) bandwidth requirements for communicating hierarchical image data to a graphics engine.

DETAILED DESCRIPTION OF THE PREFERRED EMBODIMENTS

Figure 1:
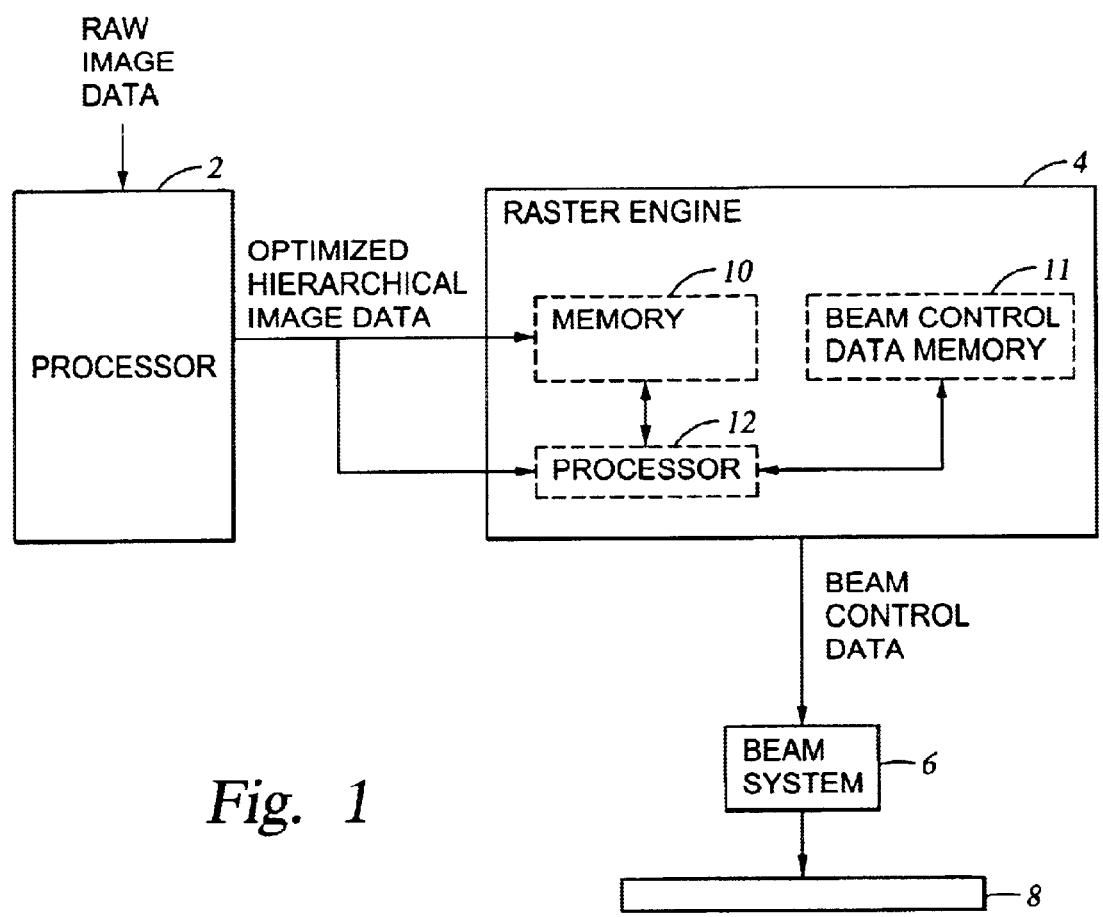
FIG. 1 is a block diagram of a system which embodies the invention.

Throughout this disclosure, including in the claims, the expression "beam control data" denotes data (whether in vector format or pixel format) that directly determines a configuration (or sequence of configurations) of beam control hardware that in turn determines what pattern is imaged on a target by a pattern generation system in response to a set of image data. The pattern generation system of the invention receives raw image data and generates beam control data in response thereto, typically with an intermediate step of generating optimized hierarchical image data from the raw hierarchical data, and generating the beam control data in response to the optimized hierarchical image data. The term "optimized" is used in a broad sense to denote "improved" (e.g., embodying an improved combination of properties, such as reduced data volume to be transferred to the graphics engine, and ability to be converted to beam control data with acceptably low processing time) as well as "improved to the maximum degree" (e.g., embodying the best possible combination of the relevant properties). In one example, the pattern generation system of the invention receives and rasterizes a set of hierarchical image data (indicative of a two-dimensional bit map) to generate a set of beam control data (in pixel format) determining a sequence of pixels to be written to the target during a raster scan.

One aspect of the inventive method is a method for generating beam control data in response to hierarchical image data. In a class of preferred embodiments, the invention rasterized hierarchical image data indicative of hierarchical CAD designs, such as designs in the conventional GDS-II format. A hierarchical design groups together (in an entity known as a "cell") data indicative of a feature (or set of features) that is to be repetitively placed in different positions on the layout (e.g., by iterating over the cell with appropriate offsets indicative of different locations on the layout). A cell of a hierarchical design can be "simple" in the sense that it consists of data that determines a repeated feature or feature set (but does not include or refer to another cell), or it can be "complex" in the sense that it includes a reference to another cell (which other cell can, but need not, be included within the complex cell) and optionally also data that determines a repeated feature or feature set (without including or referring to another cell).

A set of hierarchical image data includes one or more "primary" cells (each determining a feature or feature set that is repeated on the layout), and also additional data. The additional data includes data indicative of non-repeated features of the layout, and data referring to primary cells. Each primary cell can itself include references to one or more cells (denoted herein as secondary cells). Similarly, each secondary cell can include references to one or more cells (denoted herein as tertiary cells), and so on for higher levels of the hierarchy. If no primary cell includes a reference to a secondary cell, we shall refer to the overall set of hierarchical data as "two-level" hierarchical data (which determines a layout having two-level hierarchy). If at least one primary cell includes a reference to a secondary cell, we shall refer to the overall set of hierarchical data as "N-level" hierarchical data (where N is greater than two) which determines a layout having N-level hierarchy. In contrast with hierarchical image data, "flat" format image data (determining a "flat" layout) includes no primary cell.

The expression "cell instantiation" is used herein to denote a reference to a cell indicating that the cell is to be copied to a particular location on the layout. Such location is typically denoted by an offset.

Hierarchy becomes inevitable due to the increasing number of features in typical IC layouts, the shrinking size of critical dimensions of typical features (e.g., gate size) and the need to process correction management schemes that try to facilitate the physical reduction of critical dimensions by adding serifs and scatter bars. Hierarchical design reflects the congruent structure of repetitive building blocks of IC layout. A DRAM or FPGA (field-programmable gate array) device, for example, can define a flat-format count greater than $10^9$ features. With 8 to 10 bytes per geometry, such a design, when implemented with a flat layout, imposes hard bandwidth problems when raw image data indicative of the design is communicated from a storage device to a raster engine. The inventors have recognized that it would be desirable to implement such a design as a hierarchical design (typically having N-level hierarchy, where N is greater than two) rather than a flat design, since the only new piece of information per cell instantiation is the cell's offset on the layout, so that communicating this offset is enough. Compaction factors of hierarchical designs scale proportionally with the number of cell instantiations. Therefore communicating a cell only once to a graphics engine (along with the relevant offset per instantiation) decreases the required communication bandwidth dramatically.

The trend of growing file size for lithographic data is likely to outpace the increase of data transfer rates in pattern generation systems used for lithography. Relying on ample processing power and larger available memories rather than on fast transfer rates offers a robust and workable paradigm. The inventors have recognized that it is therefore desirable to reduce the data volume that must be transferred to graphics engines of pattern generation systems such that chunks of repeated data are transferred only once to a graphics engine and kept in memory of the graphics engine until each chunk is repeatedly referred to. In typical embodiments, the present invention browses the hierarchical data structure of image data (which can be in GDSII format) which contains geometry data determining a pattern to be imaged on a target, and identifies the most significantly repeated cells of image data. The image data is then compressed in the sense that each of its most significantly repeated cells is transferred only once to the graphics engine (for caching in memory of the graphics engine). Subroutine call commands are also transferred to the graphics engine so that the graphics engine can process the subroutine call commands to retrieve each cached cell from memory more than once (at appropriate times). The graphics engine thus inflates the compressed data transferred to it in accordance with the invention, typically with a large inflation factor due to the typically high number of instantiations of cached cells. Transferring this data only once, caching a subset of the transferred data in the graphics engine, and recalling the cached data repeatedly unclogs the download bottleneck.

More specifically, the present invention decreases the volume of image data that must be transferred to a graphics engine (e.g., raster engine) by determining a set of N-level hierarchical image data, where N is greater than one (preferably N is greater than two), transferring the hierarchical image data to the graphics engine ("GE"), and caching cells of the hierarchical image data in a memory of the GE. The GE executes subroutine call commands in response to elements of the hierarchical image data, which can be either portions of cached cells, or non-cached elements of the hierarchical image data. Each subroutine call command retrieves a cached cell (from memory of the GE) and generates beam control data (for imaging a pattern determined by the cell, at a location on the target indicated by an offset) in response to the retrieved cached cell and data indicative of the offset. In preferred embodiments, the beam control data is in pixel format, but it can alternatively be in vector format.

A preferred embodiment of the invention will be described with reference to FIG. 1. The system of FIG. 1 is programmed and otherwise configured to perform a print job in which it images a pattern on target 8 in response to a set of hierarchical raw image data. Target 8 is typically a mask (e.g., a piece of chrome-coated quartz glass) which can be used to produce an integrated circuit after it has been patterned as a result of such a print job. The FIG. 1 system includes beam system 6, and a pattern generation system comprising image data generation system 2 and graphics engine 4. Beam system 6 can project a beam (an electron beam or laser beam) on target 8 to image a spot thereon, and can sweep the beam along a raster scan path relative to target 8 to image a sequence of pixels thereon. Target 8 can be mounted on a movable stage (not shown), so that motion of both the stage and the beam can be controlled to cause the beam to sweep along the raster scan path in the target's frame of reference.

Image data generation system 2 is configured to generate a set of optimized hierarchical image data in response to a set of hierarchical raw image data indicative of the pattern to be imaged on target 8. System 2 is typically implemented as a programmed processor, and thus is sometimes referred to below as "processor" 2. In a preferred implementation, graphics engine 4 is a raster engine (including memories 10 and 11 and processor 12) which is coupled to receive the optimized hierarchical image data from processor 2, and configured to store at least one cell of the optimized hierarchical image data in memory 10, generate beam control data (or a precursor thereto) in response to the optimized hierarchical image data (including by retrieving stored data from memory 10), store beam control data (or a precursor to beam control data) in memory 11, and retrieve beam control data from memory 11 (or retrieve the precursor data from memory 11 and generate beam control data in response thereto) and send the beam control data to beam system 6 (or generate the beam control data and send it directly to system 6 without storing it, or a precursor thereto, in memory 11) to cause system 6 to execute a raster scan of the beam relative to target 8. The beam control data asserted by the pattern generation system of FIG. 1 to system 6 is in pixel format. However, it is contemplated that alternative embodiments of the invention will generate beam control data having vector format.

Processor 12 of raster engine 4 is programmed to execute a subroutine call in response to each element of the hierarchical image data (to be referred to as a "subroutine call command") indicating that an identified cell should be retrieved from memory 10 and identifying a location on the target at which (or beginning at which) a pattern determined by such cell should be imaged. The subroutine call command typically identifies the location on the target by identifying an offset value that determines a location in the pattern to be imaged, and the latter location corresponds to the location on the target. Each subroutine call command can be a portion of a cached cell being retrieved from memory 10 (e.g., when a primary cell being retrieved includes a subroutine call command indicating that a secondary cell should be retrieved before the rest of the primary cell is retrieved) or it can be a non-cached portion of the optimized hierarchical image data. In typical implementations, each subroutine call command includes data indicative of an offset (from a single identified location of the overall pattern to be imaged on target 8), and causes processor 12 to retrieve a cached cell from memory 10 and generate beam control data (for imaging a pattern determined by the cell at, or beginning at, the location indicated by the offset) in response to the retrieved cell.

In alternative implementations of the FIG. 1 system, processor 12 generates a cell of beam control data in response to each cell of optimized hierarchical image data transferred to raster engine 4 from processor 2, and raster engine 4 caches the cell of beam control data in memory 10 or 11 rather than the corresponding cell of image data received from processor 2. Each cached beam control data cell remains statically in the memory throughout the entire lifetime of a print job. Subroutine call commands for each cached cell of beam control data are distributed throughout each set of optimized hierarchical image data received from processor 2, and each subroutine call executed by raster engine 4 in response to one such command retrieves a cell of beam control data from memory 10 (or 11) and causes beam system 6 to image a pattern determined by the retrieved cell on target 8 beginning at a location determined by the command (i.e., a location determined by an offset included in the command).

In one class of implementations of the FIG. 1 system, processor 2 is programmed with software for generating optimized two-level hierarchical image data in response to two-level hierarchical raw image data (raw image data having primary cells but no secondary cell), and such software refers to variables and constants defined as follows:

total number of geometries defined by the entire set of image data: TGC;

cell's bounding box extent: CEX;

number of instantiations of a cell (within the entire set of image data): CNI;

cell's local figure count, including arrayed primitives: CFC;

cell's percentage of the total size (volume) of the entire set of image data in which it is instantiated: CPO=(CNI)(CFC)/TGC;

residual flat output for the entire set of image data: RFO=[1−ΣCPO]TGC, where the summation is over all analyzed cells;

cell's equivalent memory: CEM=a×CFC (where a is a constant. In one implementation, a=8);

cell's output due to its encoded instantiations (i.e., the volume of data, to be included in the optimized hierarchical image data, that is required to call the cell repeatedly (after the cell has been cached in the GE) to implement all instantiations of the cached cell): CIO=b×CNI (where b is a constant. In one implementation, b=12);

GE memory available (i.e., the size of that portion of memory 10 of raster engine 4 available for caching): GEM;

library output (i.e., volume of the non-cached "call-data" portion of the total set of optimized hierarchical image data, which is employed to implement all calls of each cached cell of the optimized hierarchical image data. The call-data includes all subroutine call commands which refer to cached cells): LO=ΣCIO summing over all analyzed cells;

projected size of entire set of optimized hierarchical image data, not including the cells thereof to be cached: PFS=LO+RFO; and maximum size of the set of optimized image data to be transferred to the GE (not including the cells thereof to be cached): FSL (for example, FSL can be 13 Gbytes).

Processor 2, when programmed with the noted software, performs the following operations in the indicated sequence to generate a set of optimized two-level hierarchical image data in response to a set of two-level hierarchical raw image data:

1. Begin: identify the hierarchy graph determined by the hierarchical raw image data, and build an indexing structure which sorts the cells of the raw image data with respect to the CPO of each cell.

2. Starting with the cell having the highest CPO which has not previously been analyzed, go to step 3 if CEM≦GEM, or if CEM>GEM for all cells go to End (i.e., do not include any cell of the raw image data as a cell (to be cached) of the optimized image data).

3. For each cell for which CEM≦GEM, calculate CIO. Then, if LO+CIO<FSL go to step 5 else continue to step 4.

4. Create a new cell that contains as many instantiations of the current cell as possible, to reduce CIO.

5. Check the extent of the cell (the old cell's extent if step 5 follows step 3, or the new cell's extent if step 5 follows step 4) for library encoding (by checking that CEM for the cell satisfies CEM≦GEM), and if necessary (i.e., if CEM for the cell is greater than GEM) break the cell into multiple cells.

6. Update GEM (the amount of available GE memory) and LO (the library output).

7. Calculate the projected size ("PFS") of the entire set of optimized image data (not including the cells thereof to be cached), and if PFS>FSL go to step 2 else continue to step 8.

8. End.

For example, in step 4, a list of 40×40 of the current cell's instantiations can be grouped into the new cell. This can be implemented in a manner that depends on the proximity of the instantiations. Such grouping of many smaller cells into one larger cell reduces the number of instantiations of cells in the final version of the optimized image data by large factor (by a factor of 1600, for example to $2.8 \times 10^6$ instantiations from an original $4.47 \times 10^9$ instantiations). Thus, the size of the resulting set of the residual (noncached) portion of the optimized hierarchical image data can be reduced accordingly to a manageable size.

In other preferred implementations of the FIG. 1 system, processor 2 is programmed with software for generating optimized N-level hierarchical image data (where N is any integer greater than one) in response to M-level hierarchical raw image data (where M is any integer greater than one). In some such embodiments, the processor 2 attempts to group into a two level hierarchy the four cells of the raw image data having the largest Cell Percentage Output (above-defined CPO). In general, by increasing the number of hierarchical levels of the optimized N-level hierarchical image data (which contains cells to be cached in GE memory) generated from a set of hierarchical raw image data, the volume of the optimized hierarchical image data to be transferred to the graphics engine is decreased Preferably, processor 2 is programmed to postpone the flattening of the set of optimized hierarchical image data it generates, where "flattening" in this context denotes determination of the sequence in which each of the cells (or sub-cells) of the set of optimized data, and the data comprising the residual portion of the set of optimized data, is transmitted to raster engine 4.

Also preferably, processor 2 is programmed to map arrays to an 'arraying operator', which is passed down from the lowest hierarchical level (the "trunk") to the highest hierarchical level (a primitive). Cells at any point of the browsing (during generation of optimized hierarchical image data in response to raw image data) fully contain their embedded sub-tree. When processor 2 handles a cell, this is equivalent to handling the entire sub-tree contained in the cell. This facilitates a natural encoding of more than one level of hierarchy into the optimized hierarchical image data.

We next describe a preferred embodiment of software for programming processor 2 to generate optimized hierarchical image data in response to hierarchical raw image data. For purposes of this example, consider a cell ("Cell_A") which refers to N_g geometries and N_c cells, and assume that the optimized hierarchical image data includes a set ("HI") of "c" of such cells where "c" is an integer: HI={Cell_A_1–Cell_A_N_c}. Also assume that each cell in HI refers to at least one geometry (i.e., N_g is greater than zero for each cell in the set), and that each cell in set HI occurs at least twice in the total set of optimized hierarchical image data.

To characterize the optimized hierarchical image data with a two-level hierarchy, the software would (for each Cell_A_i) aggregate the cell's N_g geometries into a number of frames, each of which is intended to cover a specific area (e.g., an area of size 40 by 40 microns) on the target, and the software would generate the optimized hierarchical image data as the set HI of cells (each cell comprising a sequence of frames) together with a set of residual data. The residual data comprises non-repeated data (which can also be aggregated into frames) that is not included in any of the cells of set HI, and also "call-data" that determines each instantiation of each of the cells in the coordinate system of the entire set of optimized hierarchical image data. The call-data preferably includes a subroutine call command for each instantiation of a cell, including an offset for each instantiation of each cell in the coordinate system of the entire set of optimized hierarchical image data, and an absolute address to each cell to be called (an address for the list of geometries comprising the cell).

To generate three-level optimized hierarchical image data in response to raw image data having a three-level hierarchy, the software would (for each Cell_A_i) identify at least one sub-cell (i.e., a "sub-cell" set comprising at least one sub-cell), where each sub-cell in the sub-cell set occurs repeatedly within the cell. The software would characterize the cell by the following data: the sub-cell set; and a set of residual cell data comprising non-repeated data of the cell (which non-repeated data can be aggregated into frames) and call-data that determines each instantiation of each sub-cell within the cell. The software would generate the entire set of optimized hierarchical image data as: data (to be cached) determining all the sub-cells (of all the cells of set HI), residual cell data to be cached ("first residual cell data"), and a set of additional residual data. The first residual cell data determines the set (HI) of cells, each of the cells comprising a sequence of subroutine call commands and cell residual data, each of the subroutine call commands being for instantiation of one of the cached sub-cells, and the cell residual data for a cell comprising the non-repeated data of the cell. Typically, the first residual cell data comprises a sequence of subroutine call commands (for instantiating cached sub-cells) interspersed with cell residual data of one of the cells, followed by more subroutine call commands (for instantiating cached sub-cells) interspersed with cell residual data of another one of the cells, and so on. Typically, each of the subroutine call commands of the first residual cell data determines an offset for instantiation of a sub-cell in the coordinate system of one of the cells (the "calling cell") of set HI, and an absolute address to each sub-cell to be called (an address at which the list of geometries comprising the sub-cell is cached). The set of additional residual data (which is not to be cached) comprises non-repeated data of the optimized hierarchical set of image data which is not part of any cell of set HI (the non-repeated data can be aggregated into frames), and also call-data which determines each instantiation of each cell in the total set of optimized hierarchical image data. The call-data preferably includes a subroutine call command for each instantiation of a cell, including an offset for each instantiation of the cell in the coordinate system of the entire set of optimized hierarchical image data, and an absolute address to each cell to be called (an address for the list of geometries and subroutine call commands comprising the cell). In response to each subroutine call command of the call-data, the GE retrieves a cached cell, sequentially executes the subroutine call commands of the retrieved cell, and intersperses the data of each sub-cell retrieved in response to one of the subroutine call commands of the retrieved cell with the cell residual data of the retrieved cell.

Alternatively, to generate two-level optimized hierarchical image data in response to raw image data having a three-level hierarchy, the software would (for each Cell_A_i) identify at least one sub-cell (i.e., a "sub-cell" set of at least one sub-cell), where each sub-cell in the sub-cell set occurs repeatedly within the cell, and the software would characterize the cell by the following data: the sub-cell set; and a set of residual cell data. The residual cell data would comprise non-repeated data of the cell (which non-repeated data can be aggregated into frames) and also call-data that determines each instantiation of each sub-cell within the cell. The software would generate the entire set of optimized hierarchical image data as: data (to be cached) determining all the sub-cells (of all the cells of set HI); and a set of residual data, where the set of residual data comprises the residual cell data for each cell of set HI (this residual cell data can be aggregated into frames), non-repeated data which is not part of any cell of set HI (the non-repeated data can also be aggregated into frames), and revised call-data (derived from the call-data of each cell and call-data of the raw image data). The revised call-data determines each instantiation of each sub-cell in the total set of optimized hierarchical image data. The revised call-data preferably includes a subroutine call command for each instantiation of a sub-cell, including an offset for each instantiation of each sub-cell in the coordinate system of the entire set of optimized hierarchical image data, and an absolute address to each sub-cell to be called (an address for the list of geometries comprising the sub-cell).

The above-described methods for generating three-level (or two-level) optimized hierarchical image data in response to raw image data having a three-level hierarchy can readily be generalized to generate N-level optimized hierarchical image data in response to raw image data having M-level hierarchy follows in a recursive manner in accordance with the invention. This is done by working from the terminal cells in a given branch, up to the referring cell (e.g., from the set HI to Cell_A). Note that the same is true for arrays of cells. The benefit of using additional levels of hierarchy is to reduce further the size of the file (to be transferred to the graphics engine) which determines the optimized hierarchical image data.

More generally, in a class of embodiments, the invention is a processor (e.g., processor 2 of FIG. 1) that is programmed to generate a set of hierarchical image data having at least two levels of hierarchy in response to a set of hierarchical raw image data, such that the hierarchical image data includes residual data and at least one cell, each said cell determines a feature set of a pattern, the residual data includes at least two subroutine call commands, and each of the subroutine call commands identifies a cell of said at least one cell and a portion of a target at which the feature set determined by the cell is to be imaged, where the processor is programmed with software for:

(a) determining a hierarchy graph for the raw image data, identifying said hierarchy graph as a tentative hierarchy graph of a tentative version of the hierarchical image data, and sorting (e.g., determining an indexing structure which sorts) cells of the tentative hierarchy graph according to their individual size relative to total size of the set of raw image data;

(b) identifying one of the cells of the tentative hierarchy graph whose size is largest relative to the total size of the tentative version of the hierarchical image data, and if the size of said one of the cells does not exceed a cacheable size, determining whether inclusion of said one of the cells as a cell of the hierarchical image data would cause the size of the residual portion of the hierarchical image data to exceed a predetermined maximum size;

(c) if inclusion of said one of the cells as a cell of the hierarchical image data would cause the size of the residual portion of the hierarchical image data to exceed the predetermined maximum size, identifying a new cell that contains multiple instantiations of said one of the cells and has size that does not exceed the cacheable size, updating the tentative hierarchy graph and the tentative version of the hierarchical image data by replacing the multiple instantiations of said one of the cells with said new cell, thereby determining an updated hierarchy graph and an updated version of the hierarchical image data, and if the size of the residual portion of the updated hierarchical image data does not exceed the predetermined maximum size, identifying the updated hierarchical image data as the hierarchical image data.

Also within the scope of the invention is a method for generating a set of hierarchical image data having at least two levels of hierarchy in response to a set of hierarchical raw image data, such that the hierarchical image data includes residual data and at least one cell, each said cell determines a feature set of a pattern, the residual data includes at least two subroutine call commands, and each of the subroutine call commands identifies a cell of said at least one cell and a portion of a target at which the feature set determined by the cell is to be imaged, said method including the steps of:

(a) determining a hierarchy graph for the raw image data, identifying said hierarchy graph as a tentative hierarchy graph of a tentative version of the hierarchical image data, and sorting (e.g., determining an indexing structure which sorts) cells of the tentative hierarchy graph according to their individual size relative to total size of the set of raw image data;

(b) identifying one of the cells of the tentative hierarchy graph whose size is largest relative to the total size of the tentative version of the hierarchical image data, and if the size of said one of the cells does not exceed a cacheable size, determining whether inclusion of said one of the cells as a cell of the hierarchical image data would cause the size of the residual portion of the hierarchical image data to exceed a predetermined maximum size;

(c) if inclusion of said one of the cells as a cell of the hierarchical image data would cause the size of the residual portion of the hierarchical image data to exceed the predetermined maximum size, identifying a new cell that contains multiple instantiations of said one of the cells and has size that does not exceed the cacheable size, updating the tentative hierarchy graph and the tentative version of the hierarchical image data by replacing the multiple instantiations of said one of the cells with said new cell, thereby determining an updated hierarchy graph and an updated version of the hierarchical image data, and if the size of the residual portion of the updated hierarchical image data does not exceed the predetermined maximum size, identifying the updated hierarchical image data as the hierarchical image data.

Also within the scope of the invention is a method for generating a set of hierarchical image data to be transferred to a graphics engine, in response to a set of hierarchical raw image data, such that the hierarchical image data has at least two levels of hierarchy and includes residual data and at least one cell, each said cell determines a feature set of a pattern, the residual data includes at least two subroutine call commands, and each of the subroutine call commands identifies a cell of said at least one cell and a portion of a target at which the feature set determined by the cell is to be imaged, said method including the steps of:

determining a hierarchy graph for the raw image data, and determining a tentative version of the hierarchical image data having said hierarchy graph; and modifying the tentative version of the hierarchical image data to determine an optimized version of the hierarchical image data which achieves an optimal combination of reduced data volume relative to the data volume of the raw image data, and reduced time required for generation of beam control data from the optimized hierarchical image data in the graphics engine relative to the time required for generation of the beam control data from the raw image data in the graphics engine.

For example, in a class of implementations of the FIG. 1 system, processor 2 is programmed with software for generating optimized hierarchical image data in response to hierarchical raw image data by assigning a figure of merit to each candidate cell, and using the assigned figures of merit to determine the cells of the optimized hierarchical image data. The figure of merit ("FOM") indicates, in some sense, how much benefit would be derived from caching the candidate cell and retrieving it at least twice (each time in response to a subroutine call command). The FOMs are sorted in decreasing (or increasing) order of FOM, and only those cells whose FOM exceeds a minimum value (or is less than a maximum value) are eligible for inclusion as cells (to be cached) of the optimized hierarchical image data. Those cells whose FOM exceeds the minimum value (or is less then the maximum value) and which satisfy any other criterion or criteria imposed by the programmer, are actually included as cells to be cached of the optimized hierarchical image data. Each cell whose FOM does not exceed the minimum value (or exceeds the maximum value), or which does not satisfy one of the other criteria (if any) imposed by the programmer, is replaced by flat image data which is included in the residual (noncached) portion of the optimized hierarchical image data.

For example, the FOM can be the ratio Savings/Size, where:

"Savings" is the number of bytes by which the overall image data file (to be transferred to the GE) is reduced by including the cell (as a cell to be cached), along with non-cached subroutine call commands for calling the cached cell, in the optimized hierarchical image data; and "Size" is the number of bytes that the cell would occupy in the GE memory (if the cell were cached therein).

Alternatively, the FOM can be the above-defined "Savings" value alone (rather than the "Savings/Size" ratio as in the previous example).

It is conventional to program a processor (such as processor 2 of FIG. 1) with software causing it to perform a variety of operations on the raw image data it receives before it transfers the processed image data to a graphics engine. Examples of such operations are fracturing and tiling of the raw image data, and converting geometry types of the raw image data into another format such as the Alta Binary Format (ABF) employed in pattern generation equipment marketed by Etec System, Inc. In some embodiments of the present invention, the software which programs processor 2 is a modified version of such conventional software which performs the functions of the conventional software as well as the functions required to implement the invention.

It should be understood that the GE memory in which cells of hierarchical image data are cached in accordance with the invention can be a special-purpose cache memory of the GE (used only for the purpose of caching such cells) or it can be a portion of a multi-purpose memory of the GE (which multi-purpose memory is also used by the GE for at least one purpose other than caching of such cells).

It should also be understood that while certain forms of the present invention have been illustrated and described herein, the invention is not to be limited to the specific embodiments described and shown or the specific methods described.

What is claimed is:

1. A pattern generation system which generates beam control data for causing at least one beam to image a pattern on a target, said pattern generation system comprising:

a data generation subsystem configured so that a set of hierarchical image data having at least three levels of hierarchy is generated and asserted, wherein the hierarchical image data includes residual data and a set of cells, each of the cells determines a feature set of the pattern, the residual data includes at least two subroutine call commands, and each of the subroutine call commands identifies a cell of the set of cells and a portion of the target at which the feature set determined by the cell is to be imaged; and a graphics engine having a memory, wherein the graphics engine is coupled and configured so that hierarchical image data is received, and said set of cells is stored upon receipt of the hierarchical image data, so that beam control data is generated in response to the residual data and the contents of the memory, wherein the graphics engine is configured so that a response is made to each of at least two of the subroutine call commands by retrieving one of the cells from the memory and generating a portion of the beam control data which controls imaging of the feature set determined by said one of the cells at the portion of the target identified by each of at least two of the subroutine call commands, wherein the set of cells includes at least one primary cell and at least one secondary cell, the subroutine call commands include at least two primary call commands and at least two secondary call commands, the primary cell includes said at least two secondary call commands, the graphics engine is configured so that a response is made to each of at least two of the primary call commands by retrieving the primary cell from the memory and generating a portion of the beam control data which controls imaging of the feature set determined by the primary cell at the portion of the target identified by said each of at least two of the primary call commands, and the graphics engine is configured so that a response is made to each of at least two of the secondary call commands by retrieving the secondary cell from the memory and generating a portion of the beam control data which controls imaging of the feature set determined by the secondary cell at the portion of the target identified by each of at least two of the secondary call commands.

2. The system of claim 1, wherein the beam control data is in pixel format.

3. The system of claim 1, also including:

a beam system, coupled to receive the beam control data from the graphics engine and configured so that the pattern on the target is imaged in response to the beam control data, wherein the beam system is configured so that a response is made to the beam control data by operating in a sequence of configurations which cause the at least one beam to image the pattern on the target.

4. The system of claim 3, wherein the graphics engine is a raster engine, and wherein the beam system is configured so that a response is made to the beam control data by executing a raster scan of the at least one beam relative to the target.

5. The system of claim 1, wherein the data generation subsystem includes a processor programmed to generate the set of hierarchical image data in response to a set of hierarchical raw image data, wherein the processor is programmed with software for:

determining a hierarchy graph for the raw image data, identifying said hierarchy graph as a tentative hierarchy graph of a tentative version of the hierarchical image data, sorting cells of the tentative hierarchy graph according to a figure of merit, and classifying the cells of the tentative hierarchy graph into a first cell set and a second cell set such that each cell in the first cell set satisfies at least one predetermined criterion including the criterion that the figure of merit of each cell of the first cell set has a predetermined relation to a threshold value, and second cell set consists of each of the cells that is not in the first cell set; and determining the hierarchical image data from the hierarchical raw image data by replacing the second cell set and the subroutine calls to each cell in the second cell set with replacement residual data, such that the hierarchy graph of the hierarchical image data includes the first cell set but not the second cell set, and the residual data of the hierarchical image data includes the replacement residual data.

6. The system of claim 1, wherein the data generation subsystem includes a processor programmed to generate the set of hierarchical image data in response to a set of hierarchical raw image data, wherein the processor is programmed with software for:

determining a hierarchy graph for the raw image data, identifying said hierarchy graph as a tentative hierarchy graph of a tentative version of the hierarchical image data, and sorting cells of the tentative hierarchy graph according to their individual size relative to total size of the set of raw image data;

identifying one of the cells of the tentative hierarchy graph whose size is largest relative to the total size of the tentative version of the hierarchical image data, and if the size of said one of the cells does not exceed a cachable size, determining whether inclusion of said one of the cells as a cell of the hierarchical image data would cause the size of the residual portion of the hierarchical image data to exceed a predetermined maximum size; and if inclusion of said one of the cells as a cell of the hierarchical image data would cause the size of the residual portion of the hierarchical image data to exceed the predetermined maximum size, identifying a new cell that contains multiple instantiations of said one of the cells and has size that does not exceed the cachable size, updating the tentative hierarchy graph and the tentative version of the hierarchical image data by replacing the multiple instantiations of said one of the cells with said new cell, thereby determining an updated hierarchy graph and an updated version of the hierarchical image data, and if the size of the residual portion of the updated hierarchical image data does not exceed the predetermined maximum size, identifying the updated hierarchical image data as the hierarchical image data.

7. A graphics engine which generates beam control data for causing at least one beam to image a pattern on a target, said graphics engine comprising:

a memory coupled to receive a set of hierarchical image data having at least three levels of hierarchy, wherein the hierarchical image data includes residual data and a set of cells, each of the cells determines a feature set of the pattern, the residual data includes at least two subroutine call commands, and each of the subroutine call commands identifies a cell of the set of cells and a portion of the target at which the feature set determined by the cell is to be imaged, and wherein the engine is configured so that said set of cells is stored in the memory upon receipt of the hierarchical image data; and a beam control data generator coupled to the memory, wherein the beam control data generator is coupled to receive at least the residual data of the hierarchical image data and configured so that beam control data is generated in response to the residual data and the contents of the memory, and wherein the beam control data generator is configured so that a response is made to each of at least two of the subroutine call commands by retrieving one of the cells from the memory and generating a portion of the beam control data which controls imaging of the feature set determined by said one of the cells at the portion of the target identified by each of at least two of the subroutine call commands, wherein the set of cells includes at least one primary cell and at least one secondary cell, the subroutine call commands include at least two primary call conunands and at least two secondary call commands, the primary cell includes said at least two secondary call commands, the beam control data generator is configured so that a response is made to each of at least two of the primary call commands by retrieving the primary cell from the memory and generating a portion of the beam control data which controls imaging of the feature set determined by the primary cell at the portion of the target identified by said each of the primary call commands, and the beam control data generator is configured to respond to each of at least two of the secondary call commands by retrieving the secondary cell from the memory and generating a portion of the beam control data which controls imaging of the feature set determined by the secondary cell at the portion of the target identified by said each of at least two of the secondary call commands.

8. The engine of claim 7, wherein the beam control data is in pixel format.

9. A pattern generation system which generates beam control data for causing at least one beam to image a pattern on a target, said pattern generation system comprising:

a data generation subsystem configured so that a set of hierarchical image data having at least three levels of hierarchy is generated and asserted, wherein the hierarchical image data includes residual data and cells, the cells include at least one primary cell determining a feature set of the pattern and at least one secondary cell determining a feature set of the pattern, the residual data includes at least two subroutine call commands for each of the cells, and each of the subroutine call commands identifies one of the cells and a portion of the target at which the feature set determined by said one of the cells is to be imaged; and a graphics engine having a memory, wherein the graphics engine is coupled and configured so that the hierarchical image data is received, and in response, a beam control data cell is generated and stored in the memory in response to each of the cells of the hierarchical image data, and beam control data is generated in response to the residual data and the contents of the memory, and wherein the graphics engine is configured so that a response is made to each of the subroutine call commands by retrieving one said beam control data cell from the memory.

10. The system of claim 9, wherein the beam control data is in pixel format.

11. The system of claim 9, also including:

a beam system, coupled to receive the beam control data from the graphics engine and configured so that the pattern on the target is imaged in response to the beam control data, wherein the beam system is configured so that a response is made to the beam control data by operating in a sequence of configurations which cause the at least one beam to image the pattern on the target.

12. The system of claim 11, wherein the graphics engine is a raster engine, and wherein the beam system is configured so that a response is made to the beam control data by executing a raster scan of the at least one beam relative to the target.

13. A graphics engine which generates beam control data for causing at least one beam to image a pattern on a target, said graphics engine comprising:
   a memory; and
   a beam control data generator coupled to the memory and to receive a set of hierarchical image data having at least three levels of hierarchy, wherein the hierarchical image data includes residual data and cells, the cells include at least one primary cell determining a feature set of the pattern and at least one secondary cell determining a feature set of the pattern, the residual data includes at least two subroutine call commands for each of the cells, and each of the subroutine call commands identifies one of the cells and a portion of the target at which the feature set determined by said one of the cells is to be imaged, wherein the beam control data generator is configured so that a bema control data cell is generated and stored in the memory in response to each of the cells, and so that the beam control data is generated in response to the residual data and the contents of the memory, and wherein the beam control data generator is configured so that a response is made to each of the at least two of the subroutine call commands by retrieving one said beam control data cell from the memory.

14. The engine of claim 13, wherein the beam control data is in pixel format.

15. A processor programmed to generate a set of hierarchical image data having at least two levels of hierarchy in response to a set of hierarchical raw image data, such that the hierarchical image data includes residual data and at least one cell, each said cell determines a feature set of a pattern, the residual data includes at least two subroutine call commands, and each of the subroutine call commands identifies a cell of said at least one cell and a portion of a target at which the feature set determined by the cell is to be imaged, wherein the processor is programmed with software for:
   (a) determining a hierarchy graph for the raw image data, identifying said hierarchy graph as a tentative hierarchy graph of a tentative version of the hierarchical image data, sorting cells of the tentative hierarchy graph according to a figure of merit, and classifying the cells of the tentative hierarchy graph into a first cell set and a second cell set such that each cell in the first cell set satisfies at least one predetermined criterion including the criterion that the figure of merit of each cell of the first cell set has a predetermined relation to a threshold value, and second cell set consists of each of the cells that is not in the first cell set; and
   (b) determining the hierarchical image data from the hierarchical raw image data by replacing the second cell set and the subroutine calls to each cell in the second cell set with replacement residual data, such that the hierarchy graph of the hierarchical image data includes the first cell set but not the second cell set, and the residual data of the hierarchical image data includes the replacement residual data.

16. The processor of claim 15, wherein said processor is programmed with software for classifying the cells of the tentative hierarchy graph into the first cell set and the second cell set such that the figure of merit of each cell of the first cell set exceeds the threshold value and the figure of merit of each cell of the second cell set does not exceed the threshold value.

17. The processor of claim 16, wherein the cells of the hierarchical image data are to be cached in a memory of a graphics engine, and the figure of merit for each cell is the size of that portion of the memory that would be occupied by said cell if said cell were cached in said memory.

18. The processor of claim 16, wherein the hierarchical image data is to be transferred to the graphics engine, the cells of the hierarchical image data are to be cached in a memory of the graphics engine, and the figure of merit for each cell is SAV/SIZE, where SIZE is the size of that portion of the memory that would be occupied by the cell if said cell were cached in said memory, and SAV is the data volume by which the overall volume of the hierarchical image data is reduced by including said cell in the hierarchical image data, along with subroutine call commands for repeatedly calling said cell after it has been cached in the memory, in place of residual data corresponding to said cell.

19. A processor programmed to generate a set of hierarchical image data having at least two levels of hierarchy in response to a set of hierarchical raw image data, such that the hierarchical image data includes residual data and a set of cells, each of the cells determines a feature set of a pattern, the residual data includes at least two subroutine call commands, and each of the subroutine call commands identifies a cell of the set of cells and a portion of a target at which the feature set determined by the cell is to be imaged, wherein the processor is programmed with software for:
   (a) determining a hierarchy graph for the raw image data, identifying said hierarchy graph as a tentative hierarchy graph of a tentative version of the hierarchical image data, and sorting cells of the tentative hierarchy graph according to their individual size relative to total size of the set of raw image data;
   (b) identifying one of the cells of the tentative hierarchy graph whose size is largest relative to the total size of the tentative version of the hierarchical image data, and if the size of said one of the cells does not exceed a cachable size, determining whether inclusion of said one of the cells as a cell of the hierarchical image data would cause the size of the residual portion of the hierarchical image data to exceed a predetermined maximum size; and
   (c) if inclusion of said one of the cells as a cell of the hierarchical image data would cause the size of the residual portion of the hierarchical image data to exceed the predetermined maximum size, identifying a new cell that contains multiple instantiations of said one of the cells and has size that does not exceed the cachable size, updating the tentative hierarchy graph and the tentative version of the hierarchical image data by replacing the multiple instantiations of said one of the cells with said new cell, thereby determining an updated hierarchy graph and an updated version of the hierarchical image data, and if the size of the residual portion of the updated hierarchical image data does not exceed the predetermined maximum size, identifying the updated hierarchical image data as the hierarchical image data.

20. A method for generating a set of hierarchical image data having at least two levels of hierarchy in response to a set of hierarchical raw image data, such that the hierarchical image data includes residual data and a set of cells, each of the cells determines a feature set of a pattern, the residual data includes at least two subroutine call commands, and each of the subroutine call commands identifies a cell of the set of cells and a portion of a target at which the feature set determined by the cell is to be imaged, said method including the steps of:

(a) determining a hierarchy graph for the raw image data, identifying the hierarchy graph as a tentative hierarchy graph of a tentative version of the hierarchical image data, and sorting cells of the tentative hierarchy graph according to their individual size relative to total size of the set of raw image data;

(b) identifying one of the cells of the tentative hierarchy graph whose size is largest relative to the total size of the tentative version of the hierarchical image data, and if the size of said one of the cells does not exceed a cachable size, determining whether inclusion of said one of the cells as a cell of the hierarchical image data would cause the size of the residual portion of the hierarchical image data to exceed a predetermined maximum size; and (c) if inclusion of said one of the cells as a cell of the hierarchical image data would cause the size of the residual portion of the hierarchical image data to exceed the predetermined maximum size, identifying a new cell that contains multiple instantiations of said one of the cells and has size that does not exceed the cachable size, updating the tentative hierarchy graph and the tentative version of the hierarchical image data by replacing the multiple instantiations of said one of the cells with said new cell, thereby determining an updated hierarchy graph and an updated version of the hierarchical image data, and if the size of the residual portion of the updated hierarchical image data does not exceed the predetermined maximum size, identifying the updated hierarchical image data as the hierarchical image data.

21. A method for generating a set of hierarchical image data to be transferred to a graphics engine, in response to a set of hierarchical raw image data, such that the hierarchical image data has at least two levels of hierarchy and includes residual data and a set of cells, each of the cells determines a feature set of a pattern, the residual data includes at least two subroutine call commands, and each of the subroutine call commands identifies a cell of the set of cells and a portion of a target at which the feature set determined by the cell is to be imaged, said method including the steps of:

determining a hierarchy graph for the raw image data, and determining a tentative version of the hierarchical image data having said hierarchy graph; and modifying the tentative version of the hierarchical image data to determine an optimized version of the hierarchical image data which achieves an optimal combination of reduced data volume relative to the data volume of the raw image data, and reduced time required for generation of beam control data from the optimized hierarchical image data in the graphics engine relative to the time required for generation of the beam control data from the raw image data in the graphics engine.

22. A method for generating a set of hierarchical image data having at least two levels of hierarchy in response to a set of hierarchical raw image data, such that the hierarchical image data includes residual data and at least one cell, each said cell determines a feature set of a pattern, the residual data includes at least two subroutine cell commands, and each of the subroutine call commands identifies a cell of said at least one cell and a portion of a target at which the feature set determined by the cell is to be imaged, said method including the steps of:

(a) determining a hierarchy graph for the raw image data, identifying said hierarchy graph as a tentative hierarchy graph of a tentative version of the hierarchical image data, sorting cells of the tentative hierarchy graph according to a figure of merit, and classifying the cells of the tentative hierarchy graph into a first cell set and a second cell set such that each cell in the first cell set satisfies at least one predetermined criterion including the criterion that the figure of merit of each cell of the first cell set has a predetermined relation to a threshold value, and second cell set consists of each of the cells that is not in the first cell set; and (b) determining the hierarchical image data from the hierarchical raw image data by replacing the second cell set and the subroutine calls to each cell in the second cell set with replacement residual data, such that the hierarchy graph of the hierarchical image data includes the first cell set but not the second cell set, and the residual data of the hierarchical image data includes the replacement residual data.

23. A method for generating beam control data for causing at least one beam to image a pattern on a target, said method comprising the steps of:

(a) generating a set of hierarchical image data having at least three levels of hierarchy, wherein the hierarchical image data includes residual data and a set of cells including at least one primary cell determining a feature set of the pattern and at least one secondary cell determining a feature set of the pattern, the residual data includes primary subroutine call commands, the primary cell includes at least two secondary subroutine call commands, each of the subroutine call commands identifies a cell of the set of cells and a portion of the target at which the feature set determined by the cell is to be imaged;

(b) storing each of the cells in a memory; and (c) generating the beam control data in response to the residual data and the contents of the memory, including by responding to each of at least two of the primary call commands by retrieving the primary cell from the memory and generating a portion of the beam control data which controls imaging of the feature set determined by the primary cell at the portion of the target identified by said each of at least two of the primary call commands, and responding to each of at least two of the secondary call commands by retrieving the secondary cell from the memory and generating a portion of the beam control data which controls imaging of the feature set determined by the secondary cell at the portion of the target identified by said each of at least two of the secondary call commands.

24. The method of claim 23, wherein step (c) is performed such that the beam control data is in pixel format.

25. The method of claim 23, also including the step of:

(d) in response to the beam control data, operating a beam system in a sequence of configurations which cause the at least one beam to image the pattern on the target.

26. The method of claim 25, wherein the beam system executes a raster scan of the at least one beam relative to the target during step (d).

27. A method for generating beam control data for causing at least one beam to image a pattern on a target, said method comprising the steps of:

(a) operating a graphics engine to receive a set of hierarchical image data having at least three levels of hierarchy and comprising a set of cells including at least one primary cell determining a feature set of the pattern and at least one secondary cell determining a feature set of the pattern, and residual data, and to store the primary cell and the secondary cell in a memory, wherein the residual data includes primary subroutine call commands, and the primary cell includes secondary call commands, wherein each of the subroutine call commands identifies one of the cells and a portion of the target at which the feature set determined by said one of the cells is to be imaged; and (b) operating the graphics engine to generate the beam control data in response to the residual data and the contents of the memory, including by responding to each of at least two of the primary call commands by retrieving the primary cell from the memory and generating a portion of the beam control data which controls imaging of the feature set determined by the primary cell at the portion of the target identified by said each of at least two of the primary call commands, and responding to each of at least two of the secondary call commands by retrieving the secondary cell from the memory and generating a portion of the beam control data which controls imaging of the feature set determined by the secondary cell at the portion of the target identified by said each of at least two of the secondary call commands.

28. The method of claim 27, wherein step (b) is performed such that the beam control data is in pixel format.

29. The method of claim 27, also including the step of:

(c) in response to the beam control data, operating a beam system in a sequence of configurations which cause the at least one beam to image the pattern on the target.

30. The method of claim 29, wherein the beam system executes a raster scan of the at least one beam relative to the target during step (c).

31. A method for generating beam control data for causing at least one beam to image a pattern on a target, said method comprising the steps of:

(a) operating a graphics engine to receive a set of hierarchical image data having at least three levels of hierarchy and comprising a set of cells including at least one primary cell and at least one secondary cell, and to generate and store in a memory a beam control data cell in response to each said primary cell and each said secondary cell of the hierarchical image data, wherein the hierarchical image data also includes residual data including subroutine call commands, and each of the subroutine call commands identifies one said beam control data cell and a portion of the target at which a feature set determined by said beam control data cell is to be imaged; and (b) operating the graphics engine to generate the beam control data in response to the residual data and the contents of the memory, including by responding to each of at least two of the subroutine call commands by retrieving one said beam control data cell from the memory.

32. The method of claim 31, wherein step (b) is performed such that the beam control data is in pixel format.

33. The method of claim 32, also including the step of:

(c) in response to the beam control data, operating a beam system in a sequence of configurations which cause the at least one beam to image the pattern on the target.

34. The method of claim 33, wherein the beam system executes a raster scan of the at least one beam relative to the target during step (c).

* * * * *